United States Patent [19]

Ohkura

[11] Patent Number: 4,870,471
[45] Date of Patent: Sep. 26, 1989

[54] COMPLEMENTARY METAL-OXIDE SEMICONDUCTOR INTEGRATED CIRCUIT DEVICE WITH ISOLATION

[75] Inventor: Isao Ohkura, Itami, Japan

[73] Assignee: Mitsubishi Denki Kabushiki Kaisha, Tokyo, Japan

[21] Appl. No.: 432,387

[22] Filed: Sep. 30, 1982

[30] Foreign Application Priority Data

Apr. 23, 1981 [JP] Japan .................. 56-62909

[51] Int. Cl.$^4$ .................................. H01L 27/02
[52] U.S. Cl. ........................ 357/42; 357/41; 357/47; 357/53; 307/253
[58] Field of Search .......... 357/42, 44, 53, 40, 357/41, 47; 307/253

[56] References Cited

U.S. PATENT DOCUMENTS

| | | | |
|---|---|---|---|
| 3,967,988 | 7/1976 | Davidsohn | 357/41 X |
| 4,161,662 | 7/1979 | Malcolm et al. | 357/42 X |
| 4,233,672 | 11/1980 | Suzuki et al. | 357/42 X |
| 4,240,093 | 12/1980 | Dingwall | 357/42 |
| 4,288,804 | 9/1981 | Kikuchi et al. | 357/42 |
| 4,356,504 | 10/1982 | Tozun | 357/42 |

FOREIGN PATENT DOCUMENTS 2104284  3/1983  United Kingdom .................. 357/42

OTHER PUBLICATIONS

Ashida et al.: "A 3000-Gate CMOS Masterslice LSI", Japanese Journal of Applied Physics, vol. 19, (1980) Supplement 19-1, pp. 203-212.

*Primary Examiner*—William Mintel
*Attorney, Agent, or Firm*—Lowe, Price, Leblanc, Becker & Shur

[57] ABSTRACT

A complementary metal-oxide semiconductor integrated circuit device comprises a plurality of pairs of N- and P-channel metal-oxide semiconductor transistors ($\theta 1a, \theta 2a, \theta 3a, \theta 4a, \theta 1b, \theta 2b, \theta 3b, \theta 4b$). The plurality of pairs are juxtaposed with respect to each other and no isolation areas are formed between the respective pairs. A single pair or a series of pairs out of the plurality of pairs constitute a functional device (30). The gate electrodes (311a, 311b) of the N- and P-channel metal-oxide semiconductor transistors in the pair adjacent to the functional device (30) are held in relatively negative (GND) and positive ($V_{DD}$) potential voltages, respectively, so that the functional device (30) is electrically isolated from the remaining portions.

14 Claims, 3 Drawing Sheets 4,870,471

COMPLEMENTARY METAL-OXIDE SEMICONDUCTOR INTEGRATED CIRCUIT DEVICE WITH ISOLATION

BACKGROUND OF THE INVENTION

1. Field of the Invention

The present invention relates to a complementary metal-oxide semiconductor integrated circuit device and more particularly, relates to an improvement of an arrangement of a unit cell and a manner of isolation between functional devices in a complementary metal-oxide semiconductor integrated circuit device in which a plurality of unit cells, such as a transistor array and a gate array are juxtaposed.

2. Description of the Prior Art

FIG. 1 shows an arrangement of a gate array in a conceptual manner. The gate array comprises an input-output circuit portion 1, an internal wiring portion 2 and an internal gate circuit portion 3. The internal gate circuit portion 3 is adapted such that a plurality of unit cells are juxtaposed. Generally, the internal gate circuit portion 3 may include a single type of unit cell or may include a plurality of types of unit cells. A functional device having a logic function is structured by a single unit or cell by a plurality of unit cells, or a plurality of functional devices are formed within a unit cell. A plurality of functional devices thus structured are interconnected by an internal wiring provided in the internal wiring portion 2 and, in addition, are connected to an input-output circuit existing in the input-output circuit portion 1, so that a logic circuit is structured.

FIG. 2 shows an example of a conventional arrangement of unit cells. A unit cell 30 encircled by a dotted line is structured to include gate regions 31a and 31b, regions 32a and 32b to become a source or a drain, to constitute a metal-oxide semiconductor transistor, and isolation regions 33 for electrically isolating the unit cell 30 from another unit cell adjacent thereto. A portion 34 encircled by a dotted chain line has a conductivity type opposite to that in a semiconductor substrate other than this portion 34, which is generally called a well. Usually, an N-type semiconductor substrate is used and thus P-type impurities are introduced into the portion 34. As a result, an N-channel metal-oxide semiconductor transistor is formed in the portion 34 encircled in a dotted chain line and a P-channel metal-oxide semiconductor transistor is formed on the semiconductor substrate side outside the portion 34. In the FIG. 2 example, three pairs of gate regions 31a and 31b are disposed in the unit cell 30, and thus a functional gate having a maximum of three inputs can be structured. However, in the FIG. 2 example, if a functional gate, a flip-flop and the like having four or more inputs are desired, a plurality of unit cells 30 must be used.

FIG. 3A shows a schematic diagram of a NOR gate having four inputs, which is structured by the above described FIG. 2 example, and FIG. 3B shows an equivalent circuit of the NOR gate having four inputs in FIG. 3A. As seen from FIGS. 3A and 3B, interconnections between metal-oxide semiconductor transistors as included in the NOR gate having four inputs are provide by a first layer of aluminum wiring including a wiring pattern having elements 41a, 41b and 411, together with another aluminum wiring pattern 42 of a second layer for providing four inputs and one output. More particularly, four N-channel metal-oxide semiconductor transistors $\theta 1a$, $\theta 2a$, $\theta 3a$ and $\theta 4a$ are connected in series, wherein the ground potential GND is applied to the source region of the transistor $\theta 4a$ through the first layer aluminum wiring 41a. On the other hand, four P-channel metal-oxide semiconductor transistors $\theta 1b$, $\theta 2b$, $\theta 3b$ and $\theta 4b$ are connected in parallel, to which the $V_{DD}$ potential is applied through the first layer aluminum wiring 41b. The gate regions of the P- and N-channel transistors in each pair are connected in common by the second layer aluminum wiring 42. Referring to FIG. 3A, four inputs IN1 to IN4 are applied to the gate electrodes 31a, 31b, 31c and 31d in the N-channel and P-channel metal-oxide semiconductor transistors through the second layer aluminum wiring 42 from the internal wiring portion 2 as shown in FIG. 1, and the output OUT is sent out to the internal wiring portion 2 through the second layer aluminum wiring 42. In the first layer aluminum wiring regions 41a and 41b are connected to the N-type or P-type source or drain regions 32a, 32c, and 32b, 32d, formed in the surface of the semiconductor substrate, by contact holes 51. The connection of the second layer aluminum wiring 42 and the gate regions 31a, 31b, 31c and 31d are made at the connecting points 52.

With such a conventional structure, there must be provided an isolation region 33 for electrically isolating a unit cell 30 from another unit cell adjacent thereto. Therefore, for example, if and when the NOR gate having four inputs is structured, three pairs of gate regions 31a and 31b and a pair of gate regions 31c and 31d are needed, which means that it is necessary to combine two unit cells 30. More particularly, two wirings 411 are needed for the purpose of making electrically equal the potential at the source or drain regions 32a and 32c in the N-channel metal-oxide semiconductor transistors and the source or drain regions 32b and 32d in the P-channel metal-oxide semiconductor transistors included in both unit cells 30. In addition, the source or drain regions in the portions to be connected by the wirings 411 become larger in area than the source or the drain regions in the remaining portions and thus stray capacitance between a semiconductor substrate or the above described well and such regions is increased, whereby signals are delayed and the operating speed of a functional gate decreases.

SUMMARY OF THE INVENTION

The present invention comprises a metal-oxide semiconductor integrated circuit device including a plurality of pairs of N- and P-channel metal-oxide semiconductor transistors having a gate electrode. The plurality of pairs are juxtaposed with respect to each other, without disposing any isolation areas between the respective pairs, and also disposed such that the N-channel metal-oxide semiconductor transistor and P-channel metal-oxide semiconductor transistor in each pair of the plurality of pairs adjoin the N-channel metal-oxide semiconductor transistor and P-channel metal-oxide semiconductor transistor in the pair adjacent thereto, respectively. A single pair or a series of pairs out of the plurality of pairs may be made to constitute a particular functional device by variation of the wiring and contact pattern. The gate electrodes of the N- and P-channel metal-oxide semiconductor transistors in the pair adjacent to the functional device are held in relatively negative and positive potential voltages so that the N-channel metal-oxide semiconductor transistor and P-channel metal-oxide semiconductor transistor are rendered nonconductive so as to isolate electrically the functional device from the remaining portions.

Accordingly, a principal object of the present invention is to provide a complementary metal-oxide semiconductor integrated circuit device having higher density of integration and higher operating speed by structuring any size of unit cells without forming isolations areas.

The object and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 4:
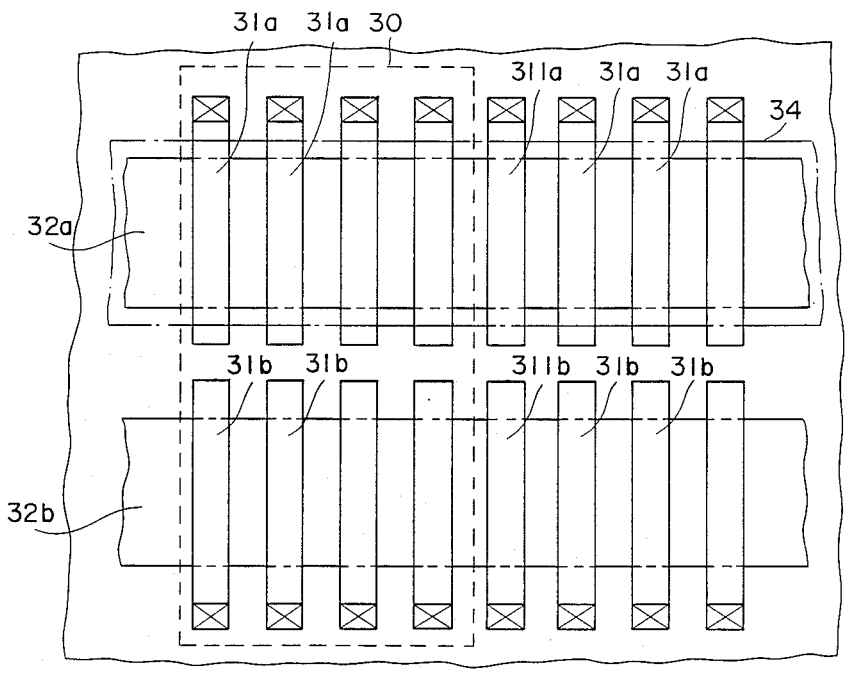
FIG. 4 is an arrangement of one embodiment of the present invention.

FIG. 4 shows an arrangement of one embodiment of the present invention, wherein the same portions as the above described conventional example are denoted by the same reference numerals and thus the explanation thereof will be omitted. As seen from the FIG. 4 embodiment, a unit cell 30 can be structured by using any number of complementary metal-oxide semiconductor transistors, since no isolation regions are needed for isolating a unit cell from another unit cell adjacent thereto. More particularly, assuming that a unit cell 30 is structured by four pairs of metal-oxide semiconductor transistors as shown in FIG. 4, gate regions in a pair of metal-oxide semiconductor transistors adjacent to the unit cell 30, that is, 311a and 311b, which are exactly the same as the other gate regions 31a and 31b, are connected to a ground potential and a positive source potential, respectively, so that the metal-oxide semiconductor transistors corresponding to the gate regions 311a and 311b are always rendered non-conductive to isolate the unit cell 30 from the adjacent regions. More particularly, the metal-oxide semiconductor transistor corresponding to the gate region 311a is an N-channel metal-oxide semiconductor transistor, as described in the foregoing, and thus can be rendered non-conductive by applying a relatively negative potential to the gate electrode thereof. On the other hand, the metal-oxide semiconductor transistor corresponding to the gate region 311b is a P-channel metal-oxide semiconductor transistor and thus can be rendered non-conductive by applying a relatively positive potential to the gate electrode thereof.

Figure 1:
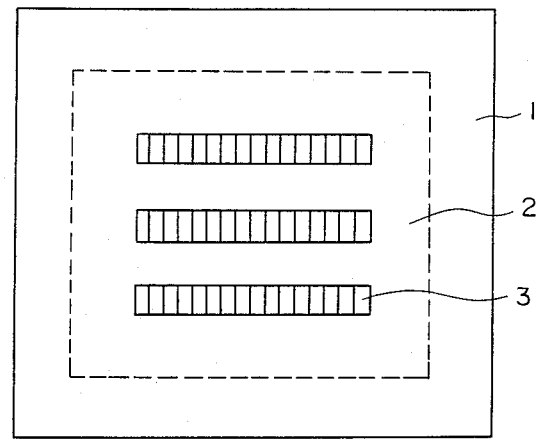
FIG. 1 shows an arrangement of a gate array in a conceptual manner.
Figure 2:
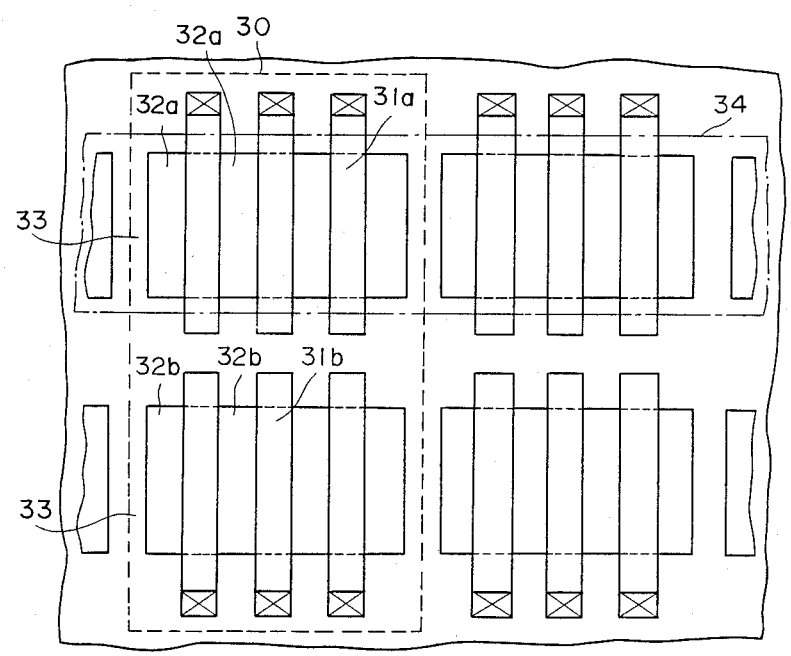
FIG. 2 shows one example of a conventional unit cell arrangement.
Figure 3A:
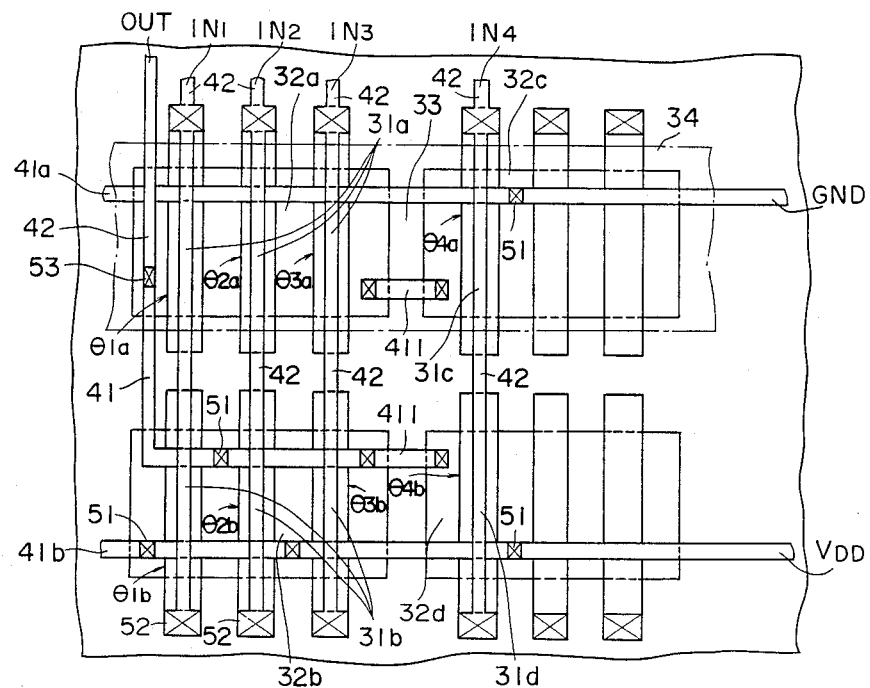
FIG. 3A shows an arrangement of a NOR gate having four inputs by using the FIG. 2 example.
Figure 3B:
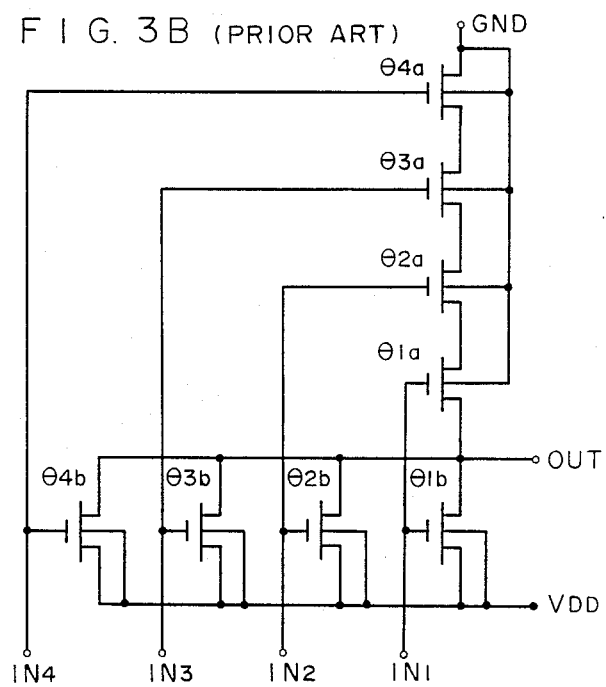
FIG. 3B is a equivalent circuit of the FIG. 3A arrangement.
Figure 5:
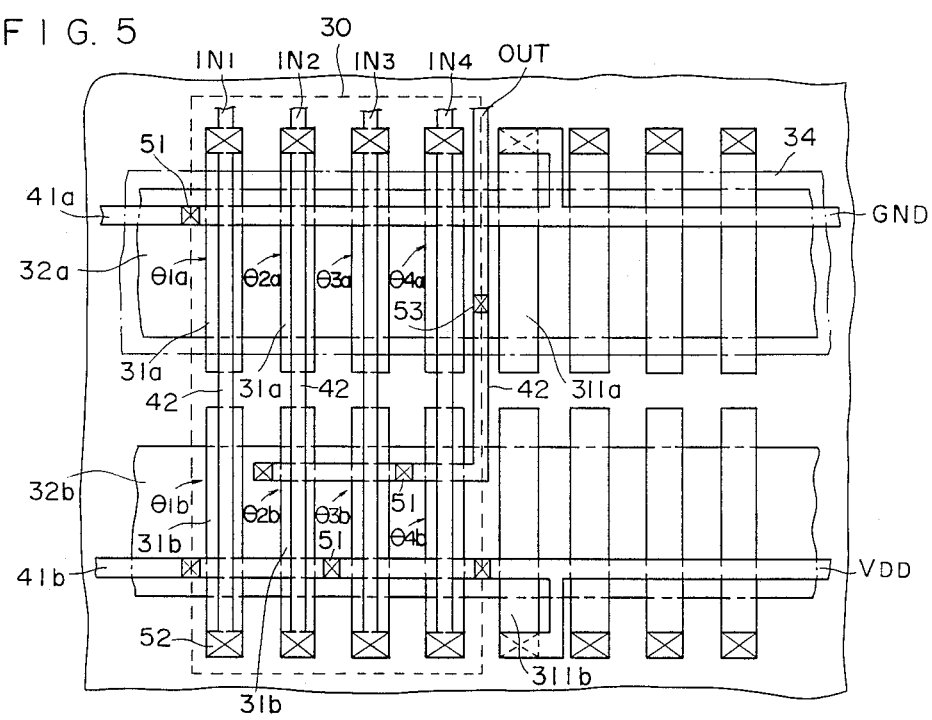
FIG. 5 is an arrangement of a NOR gate having four inputs by using the FIG. 4 embodiment.

FIG. 5 shows a specific arrangement of a NOR gate having four inputs by using the embodiment of FIG. 4, wherein the same portions as a conventional example in FIG. 3 are denoted by the same reference numerals. It thus is then believed that the FIG. 5 embodiment can be readily understood from the FIG. 4 embodiment. As shown in FIG. 5, the gate area 311a in the N-channel metal-oxide semiconductor transistor adjacent to the unit cell 30 is connected to the first layer aluminum wiring 41a which, in turn, is connected to a ground potential, and the gate region 311b in the P-channel metal-oxide semiconductor transistor adjacent to the unit cell 30 is connected to the first layer aluminum wiring 41b which, in turn, is connected to a positive potential source, $V_{DD}$. Therefore, the N-channel metal-oxide semiconductor transistor having a gate region 311a and the P-channel metal-oxide semiconductor transistor having the gate region 311b are both rendered non-conductive all the time, and thus act as an isolation area.

In the above described embodiment, although a gate with four inputs is illustrated as an example, a gate having any number of inputs may be structured as a single unit cell. In the FIG. 4 embodiment, a gate having seven inputs can be structured as a single unit cell. This concept applies to the case where a number of unit cells are needed, such as a flip-flop and the like. Although the shapes or configurations of the gate regions included in a unit cell are shown as identical, a different shape or configuration or configurations may be included in any one or more unit cell. In addition, as a matter of course, a plurality of types of unit cells may be implemented in a single integrated circuit. Furthermore, in the above described embodiment, an N-type semiconductor substrate may be used, however, a P-type substrate may be also used.

As described in the foregoing, in accordance with the inventive complementary metal-oxide semiconductor integrated circuit device wherein a plurality of pairs of P- and N-channel metal-oxide semiconductor transistors are juxtaposed with respect to each other, without disposing any isolation areas between the respective pairs, a functional device is structured by a desired number of pairs out of the plurality of pairs and the gate electrodes of the P- and N-channel metal-oxide semiconductor transistors in the pair adjacent to the functional device are held in relatively positive and negative potential voltages so that P- and N-channel metal-oxide semiconductor transistors are rendered non-conductive so as to isolate electrically the functional device from the remaining portions, there is no necessity to include either isolation regions or wiring between unit cells across the isolation regions. Therefore, the complementary metal-oxide semiconductor transistor pair can be effectively utilized and the density of integration of the device can be enhanced, with a result that an improvement in operating speed can be expected.

Although the present invention has been described and illustrated in detail, it is clearly understood that the same is by way of illustration and example only and is not to be taken by way of limitation, the spirit and scope of the present invention being limited only by the terms of the appended claims.

What is claim is:

1. A metal-oxide semiconductor integrated circuit device comprising:
   a plurality of pairs of P- and N-channel metal-oxide semiconductor transistors having gate electrodes,
   said plurality of pairs being juxtaposed with respect to each other, without disposing any isolation areas between the respective pairs, and
   said plurality of pairs being disposed such that the P-channel metal-oxide semiconductor transistor and N-channel metal-oxide semiconductor transistor in each pair of said plurality of pairs adjoin the P-channel metal-oxide semiconductor transistor and N-channel metal-oxide semiconductor transistor in the pair adjacent thereto, respectively, a desired number of pairs out of said plurality of pairs constituting a functional device having a logical function, and the gate electrodes of the P- and N-channel metal-oxide semiconductor transistors in the pair adjacent to said functional device being held in relatively positive and negative potential voltages, respectively, so that said P- and N-channel metal-oxide semiconductor transistors are rendered nonconductive so as to isolate electrically said functional device from the remaining portions.

2. A metal-oxide semiconductor integrated circuit device comprising:

common source and drain regions;

a plurality of operative circuit cells formed on said common source and drain regions, each cell having at least one pair of coupled P- and N-channel metal-oxide semiconductor transistors formed on said common source and drain regions; and an isolating means for isolating one circuit cell from an adjacent cell formed on said common source and drain regions comprising a pair of N-channel and P-channel transistors intermediate said one cell and said adjacent cell, each including a respective gate electrode associated therewith, and conductivity control means connected to said gate electrodes associated with said transistors of said isolating means for rendering the respective transistors nonconductive, wherein said isolating means substantially consists of said pair of N- and P-channel transistors, said common source and drain regions of said one cell and said adjacent cell being substantially continuous and free of isolation areas therebetween.

3. An integrated circuit as recited in claim 2 wherein said conductivity control means comprises conductors connected to said respective gate electrodes of said N- and P-channel transistors of said isolating means and to negative and positive biassing voltages, respectively.

4. An integrated circuit as recited in claim 2 wherein said one circuit cell comprises a group having a desired number of pairs of coupled P- and N-channel transistors, and said conductivity control means is connected to the gate electrodes of the pair of transistors adjacent to and formed on the common source and drain region of said group of pairs of transistors forming said one cell, thereby selecting said adjacent pair as the pair of transistors intermediate said one cell and said adjacent cell.

5. In an integrated circuit having an array of transistors substantially identical in structure to one another and having common source and drain areas substantially free of isolation areas therebetween, each transistor having a gate, the improvement comprising:

a circuit structure including an arbitrarily selected number of substantially identical pairs of said identical transistors therein and isolating means for providing isolation between said selected number of pairs of said identical transistors of said circuit structure and others of said substantially identical transistors on said integrated circuit, said isolating means comprising at least one of said substantially identical pairs of transistors in said array of substantially identical transistors, and means for providing a bias voltage to said at least one of said substantially identical pairs of transistors for rendering said at least one pair of transistors nonconductive to provide isolation between said circuit structure and said other substantially identical transistors on said integrated circuit.

6. An improved device as recited in claim 5 wherein said isolating means includes a wiring pattern provided for said integrated circuit for connecting the gate of said at least one transistor to said bias voltage thereby converting said at least one transistor from an active transistor to an isolating structure between said circuit structure and said other transistors on said integrated circuit.

7. In an integrated circuit having an array of transistors substantially identical at least in structure and having common source and drain areas substantially free of isolation areas therebetween, each transistor having a gate, the improvement comprising:

a circuit structure including an arbitrarily selected number of substantially identical pairs of N-channel and P-channel transistors therein and isolating means for providing isolation between said selected number of pairs of transistors of said circuit structure and others of said substantially identical pairs of transistors on said integrated circuit, said isolating means comprising at least one of said substantially identical pairs of transistors in said array of substantially identical transistors, and means for providing a bias voltage to said at least one of said substantially identical pairs of transistors for rendering said at least one pair of transistors nonconductive to provide isolation between said circuit structure and said other substantially identical transistors on said integrated circuit, said isolating means comprising one of said substantially identical pairs of N- and P-channel transistors adjacent said N- and P-channel transistors forming said circuit, thereby to provide isolation between N-channel transistors forming said circuit and other N-channel transistors of the array and between P-channel transistors forming said circuit and other P-channel transistors of the array.

8. In a master slice gate array for forming one or more electronic devices, said gate array including a plurality of successively arranged substantially identical gate pairs of N-channel and P-channel transistors, each of said transistors having a gate, said gate pairs used to implement said one or more electronic devices for performing arbitrarily selectable logical functions, the improvement comprising a uniform arrangement of said plurality of substantially identical gate pairs to permit location of any one of said devices at an arbitrary position in said array and to permit use of an arbitrary subset of said pairs of transistors to implement said device, and isolating means for causing any selected ones of said plurality of substantially identical gate pairs to isolate between one subset of said plurality of substantially identical gate pairs forming one of said electronic devices and another subset of said plurality of substantially identical gate pairs forming another of said electronic devices by applying a bias voltage to said selected ones of said plurality of substantially identical gate pairs, thereby providing a structure utilizing only transistor gates for isolation and wherein the isolating transistor gates are substantially identical to the transistor gates forming the electronic devices isolated thereby and permitting arbitrary configuration of electronic devices in said array.

9. An improved master slice gate array as recited in claim 8 wherein each of said plurality of substantially identical gate pairs includes a strip overlying a source area, said source area common to each of said strips, said strip having ends extending beyond edges of said source area, one of said substantially identical gate strips forming one of said isolating transistors.

10. An improved master slice gate array as recited in claim 9 wherein each of said strips includes two end portions, one end portion attached to a connecting point for interconnection to form an electronic device and the other end portion extending beyond said common source area.

11. An improved master slice gate array as recited in claim 8 wherein said uniform arrangement of said plurality of substantially identical gate pairs is substantially free of isolation areas between different ones of said gate pairs.

12. In a master slice gate array for forming one or more electronic devices, said gate array including common source and drain regions and a plurality of substantially identical gate pairs of successive N-channel and P-channel transistors used to implement said one or more electronic devices for performing arbitrarily selectable logical functions, wherein said common source and drain regions include strips having edges, the improvement comprising a uniform arrangement of said plurality of substantially identical gate pairs wherein each gate of said plurality of substantially identical gate pairs includes a gate strip overlying one of said source and drain regions, each said gate strip having ends extending beyond said edges of said one source and drain region, to permit location of any one of said devices at an arbitrary position in said array and to permit use of an arbitrary subset of said gate pairs to implement said device, and isolating means for causing any selected ones of said plurality of substantially identical gate pairs to isolate between one subset of said plurality of substantially identical gate pairs forming one of said electronic devices and another subset of said plurality of substantially identical gate pairs forming another of said electronic devices by applying a bias voltage to said selected ones of said plurality of substantially identical gate pairs, thereby providing a structure utilizing transistor gates for isolation and wherein the isolating transistor gates are substantially identical to the transistor gates forming the electronic devices isolated thereby and permitting arbitrary configuration of electronic devices in said array.

13. An improved master slice gate array as recited in claim 12 wherein said strips forming said common source and drain regions are oriented in a first direction and said gate strips of said gates are oriented in a second direction substantially perpendicular to said first direction.

14. An improved master slice gate array as recited in claim 13 wherein said isolating means utilizes transistor gates for providing isolation between said electronic devices.

* * * * *